United States Patent
Ueda

[19]

[11] Patent Number: 6,166,812
[45] Date of Patent: Dec. 26, 2000

[54] STAGE APPARATUS

[75] Inventor: Toshio Ueda, Saitama-ken, Japan

[73] Assignee: Nikon Corporation, Tokyo, Japan

[21] Appl. No.: 09/385,965

[22] Filed: Aug. 30, 1999

Related U.S. Application Data

[63] Continuation of application No. 08/936,618, Sep. 24, 1997, abandoned, which is a continuation of application No. 08/519,188, Aug. 25, 1995, abandoned.

[30] Foreign Application Priority Data

Aug. 26, 1994 [JP] Japan .................................. 6-201945

[51] Int. Cl.$^7$ .............................................. G01B 11/00
[52] U.S. Cl. ......................................... 356/401; 356/399
[58] Field of Search ................................... 356/356, 363, 356/345, 401, 400, 399

[56] References Cited

U.S. PATENT DOCUMENTS

| | | | |
|---|---|---|---|
| 5,114,234 | 5/1992 | Otsuka et al. | 356/358 |
| 5,477,304 | 12/1995 | Nishi | 355/53 |
| 5,506,684 | 4/1996 | Ota et al. | 356/401 |

*Primary Examiner*—Robert Kim
*Attorney, Agent, or Firm*—Armstrong, Westerman, Hattori, McLeland & Naughton

[57] ABSTRACT

A stage apparatus of the present invention includes a plurality of interferometers 14H, 14J, 14R for measuring the displacements of a fine adjustment stage 11 at respective measuring sites, a plurality of actuators 29h, 29j, 29r for independently moving the stage 11, and a mathematical operational conversion unit 43. Deviations ΔH, ΔJ and ΔR are derived by a subtracting displacements H, J, R of the stage 11 actually measured by the interferometers from the target displacements HT, JT, RT of the stage 11, and supplied to the mathematical operational conversion unit 43, where the target driven increments Δh, Δj, Δr are derived by a calculation using a predetermined mathematical model (this model is an inverse matrix $T^{-1}$, which is the inverse of the matrix T describing the operation for deriving the displacements measured by the interferometers from the displacement produced by the actuators). The rotational speed controllers 39A, 39B, 39C of the actuators are driven by the amounts h, j, r that correspond to the target driven increments Δh, Δj, Δr. This results in a reduced effect of any mechanical interference, so that the positioning of the fine adjustment stage 11 can be quickly achieved with high accuracy.

39 Claims, 8 Drawing Sheets

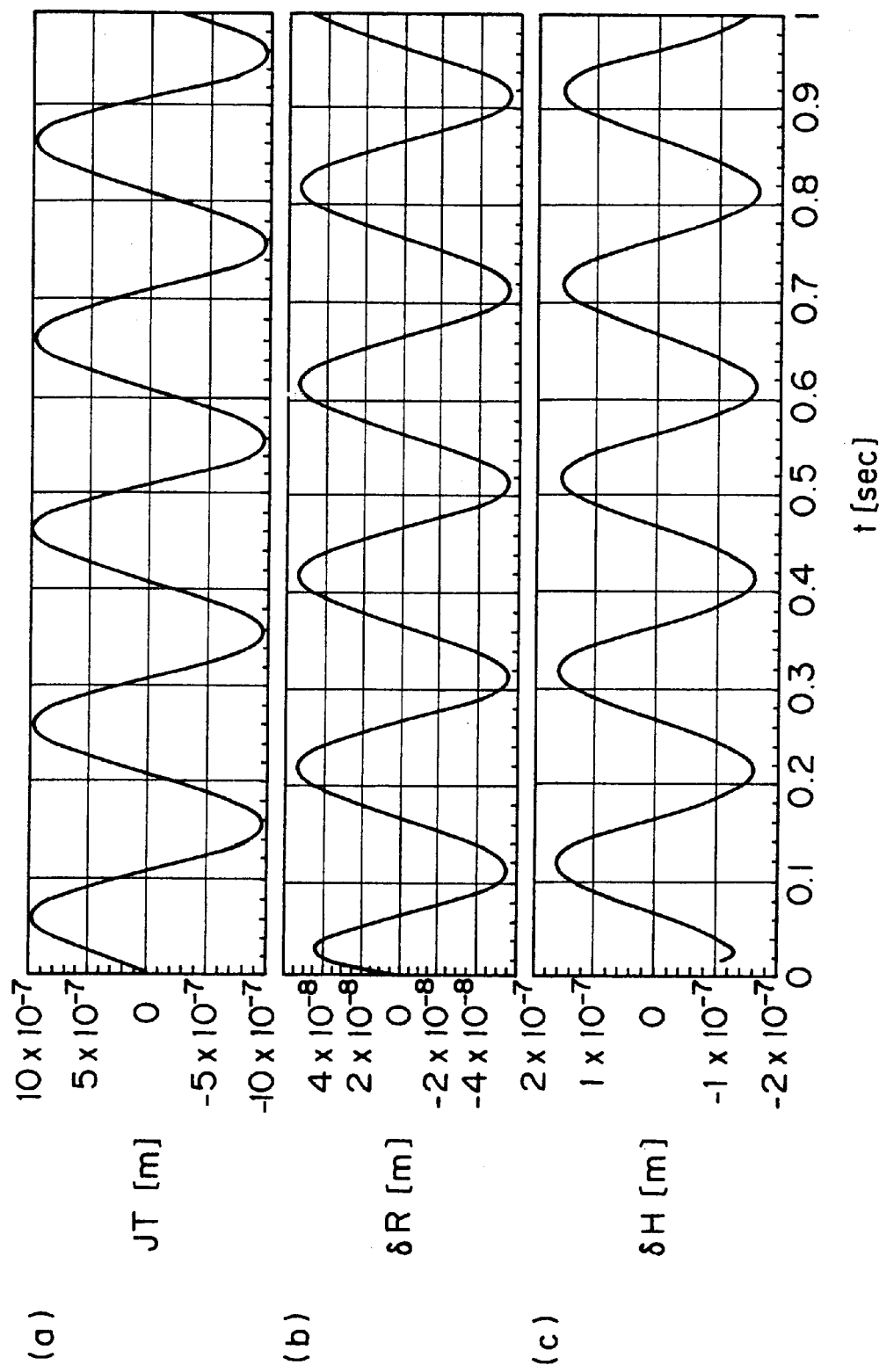

STAGE APPARATUS

This application is a continuation of prior application Ser. No. 08/936,618, filed Sep. 24, 1997 now abandoned, which is a continuation application of prior application Ser. No. 08/519,188, filed Aug. 25, 1995 now abandoned.

BACKGROUND OF THE INVENTION

1. Field of the Invention

The present invention relates to a stage apparatus for moving an object of positioning, two-dimensionally relative to a predetermined base. More particularly, the present invention relates to such a stage apparatus which may be suitably applied to reticle stages in scanning type projection exposure apparatuses used for the photo-lithographic processes to produce various devices such as semiconductor devices and liquid crystal display devices.

2. Related Art

Various types of projection exposure apparatuses are used for the photolithographic processes to produce, for example, semiconductor devices and liquid crystal display devices. In such projection exposure apparatuses, it has come to be desired to transfer a larger and larger pattern onto a wafer (or a glass substrate, etc.) by exposure, without imposing any severer requirements on the projection lens system of the projection exposure apparatus. For this reason, the scanning type projection exposure apparatuses has been noted, which include the slit-scan type and the step-and-scan type of apparatuses. In a scanning type projection exposure system, a reticle (or a photomask, etc.) is illuminated with an exposure light beam, and the reticle and a wafer are moved in synchronism with each other and relative to the projection lens system in order to carry out the scanning projection exposure, so that the image of the patterns on the reticle are transferred onto the shot areas on the wafer in order.

FIG. 6 shows a conventional step-and-scan type projection exposure apparatus. In FIG. 6, an illumination light beam EL is irradiated from an illumination system (not shown) and illuminates patterns of a slit-shaped illumination field 28 on a reticle 12. The image of the patterns on the reticle 12 is projected through a projection lens system 8 onto and within an exposure field 28W on the wafer 5. Here, we define the direction of the optical axis of the projection lens system 8 as the Z-direction, the direction perpendicular to the Z-direction and parallel to the sheet surface of FIG. 6 as the X-direction, and the direction perpendicular to the sheet surface of FIG. 6 as the Y-direction. When an exposure is made using the scanning type projection exposure technique, the reticle 12 is moved relative to the stationary, slit-shaped illumination field 28 toward +Y-direction (or −Y-direction) with a constant velocity $V_R$, while the wafer 5 is moved in synchronism with the movement of the reticle 12 toward −Y-direction (or +Y-direction) with a constant velocity $\beta \cdot V_R$, for scanning projection (where $\beta$ is the projection magnification ratio of the projection lens system 8).

The apparatus includes a drive system for driving both the reticle 12 and the wafer 5, which comprises a reticle scan stage 10 movably placed on a reticle support 9 so as to be movable in the Y-direction, and a reticle fine adjustment stage 11 placed on the scan stage 10. The reticle 12 is held on the fine adjustment stage 11 by means of, for example, a vacuum chuck. The scan stage 10 is driven by, for example, a linear motor to move relative to the reticle support 9 in the Y-direction. The fine adjustment stage 11 is driven by actuators, which are described in detail below, to make minute and precise displacements relative to the scan stage 10 in the X-direction, in the Y-direction and in the rotational direction (θ-direction), so as to control the position of the reticle 12. Moving mirrors 21 are mounted on the fine adjustment stage 11, and interferometers 14 (for the reticle) are mounted on the reticle support 9. The moving mirrors 21 and the interferometers 14 cooperate to continuously monitor the position of the fine adjustment stage 11 in the X-, Y- and θ-directions. The position information S1 acquired through the interferometers 14 is supplied to the main control system 22A. The main control system 22A controls the movements of the scan stage 10 and the fine adjustment stage 11 through a reticle stage drive system 22C.

The drive system further comprises a wafer support 1, a wafer Y-axis drive stage 2 placed on the wafer support 1 for linear motion in the Y-direction, a wafer X-axis drive stage 3 placed on the Y-axis drive stage 2 for linear motion in the X-direction, and a Z/θ-axes drive stage 4 placed on the X-axis drive stage 3. The wafer 5 is held on the Z/θ-axes drive stage 4 by means of, for example, a vacuum chuck. Moving mirrors 7 are mounted on the Z/θ-axes drive stage 4, and interferometers 13 (for the wafer) are mounted at portions of the apparatus outside the wafer support 1. The moving mirrors 7 and the interferometers 13 cooperate to continuously monitor the positions of the Z/θ-axes drive stage 4 in the X-, Y- and θ-directions. The position information acquired through the interferometers 13 is supplied to the main control system 22A as well. The main control system 22A controls the positioning operation of the wafer Y-axis drive stage 2, the wafer X-axis drive stage 3 and the Z/θ-axes drive stage 4 through a wafer stage drive system 22B, and further controls the operation of the entire apparatus.

FIG. 7(a) is a plan view of the wafer stage. In FIG. 7(a), the wafer 5 is placed on the Z/θ-axes drive stage 4. There are fixedly mounted on the Z/θ-axes drive stage 4 a moving mirror 7X for X-direction measurement and a moving mirror 7Y for Y-direction measurement. Two laser beams LWX and $LW_{OF}$ fall on the moving mirror 7X. The laser beams LWX and $LW_{OF}$ have their beam axes extending in the X-direction and spaced a predetermined distance IL from each other in the Y-direction. Two laser beams LWY1 and LWY2 from interferometers 13Y1 and 13Y2 for Y-direction measurement, respectively, fall on the moving mirror 7Y. The laser beams LWY1 and LWY2 have their beam axes extending in the Y-direction and spaced a predetermined distance IL from each other in the X-direction. During an exposure step, the coordinate value measured by the interferometer associated with the laser beam LWX is used as the X-coordinate of the Z/θ-axes drive stage 4. Also, the averaged value $((Y_{W1}+Y_{W2})/2)$ between the coordinate values $Y_{W1}$ and $Y_{W2}$ measured by the interferometers 13Y1 and 13Y2, respectively, is used as the Y-coordinate of the Z/θ-axes drive stage 4. Further, the rotational angle (angular position) of the Z/θ-axes drive stage 4 in the rotational direction (θ-direction) is derived, for example, from the difference between the coordinate values $Y_{W1}$ and $Y_{W2}$. These X- and Y-coordinates and the rotational angle are used to control the scanning velocity, position, and rotational angle of the Z/θ-axes drive stage 4 in the XY-plane.

FIG. 7(b) is a plan view of the reticle stage. In FIG. 7(b), the fine adjustment stage 11 is placed on the scan stage 10, and the reticle 12 is held on the fine adjustment stage 11 by means of, for example, a vacuum chuck. Further, there are fixedly mounted on the fine adjustment stage 11 one moving mirror 21x for X-direction measurement and two corner cubes (corner reflectors) 21y1 and 21y2 for Y-direction measurement. A laser beam LRH from an interferometer 14H falls on the moving mirror 21x in the X-direction. Laser beams LRJ and LRR from interferometers 14J and 14R for Y-direction measurement, respectively, fall on the corner cubes 21y1 and 21y2, respectively, in the Y-direction.

The laser beams LRJ and LRR, having been reflected by the corner cubes 21y1 and 21y2, are reflected back by mirrors 27 and 26, respectively. Thus, the interferometers 14J and 14R for the reticle utilize the double-path technique, which will avoid any positional displacement of the laser beam irrespective of the rotation of the fine adjustment stage 11. The interferometers 14J and 14R measure Y-coordinate values independently from each other, the Y-coordinate values being represented here by $Y_{R1}$ and $Y_{R2}$, respectively.

A further corner cube 24 is fixedly mounted on the scan stage 10, along one of the end side thereof in the +Y-direction. In addition to the above mentioned two interferometers 14J and 14R for the reticle, there is provided a third interferometer 23 for the reticle, which irradiates a laser beam LRY. The laser beam LRY is reflected by the corner cube 24 into a mirror 25, and reflected back by the mirror 25 into the corner cube 24 again, and back to the interferometer 23. The interferometer 23 uses the double-path technique, and continuously monitors the Y-coordinate $Y_{R3}$ of the scan stage 10. Like the wafer stage described above, the averaged value $((Y_{R1}+Y_{R2})/2)$ between the coordinate values $Y_{R1}$ and $Y_{R2}$ measured by the interferometers 14J and 14R, respectively, is used as the Y-coordinate $Y_R$ of the fine adjustment stage 11. The coordinate value measured by the interferometer 14H, which utilizes the single-path technique, along the measuring line H which is coincident with the axis of the laser beam LRH, is used as the X-coordinate of the fine adjustment stage 11. This coordinate value can be considered as the displacement H of the fine adjustment stage 11 relative to the scan stage 10 along the measuring line H. Please note that the measuring line H and the displacement H are referred to by using the same sign "H".

It is noted in this relation that the interferometer 14H is fixedly mounted on a stationary potion of the apparatus outside the scan stage 10, with the axis of its laser beam LRH passing through the center of the illumination field 28. Thus, when the scan stage 10 is moved in the Y-direction, the laser beam LRH moves relative to the fine adjustment stage 11 in the −Y-direction along the moving mirror 21x. Further, during a scanning projection exposure, the position of the fine adjustment stage 11 in the X-direction is controlled such that the coordinate value measured by the interferometer 14H is kept to be a constant, provided that there is no offset in the X-direction between the reticle stage and the wafer stage.

Moreover, the displacement of the fine adjustment stage 11 relative to the scan stage 10, as measured along the measuring line J which is coincident with the axis of the laser beam LRJ, is referred to as the "displacement J". Also, the displacement of the fine adjustment stage 11 relative to the scan stage 10, as measured along the measuring line R which is coincident with the axis of the laser beam LRR, is referred to as the "displacement R". Then, the displacement J has a value obtained by subtracting the coordinate value $Y_{R3}$ from the coordinate value $Y_{R1}$, while the displacement R has a value obtained by subtracting the coordinate value $Y_{R3}$ from the coordinate value $Y_{R2}$. These relationships are expressed as $$J=Y_{R1}-Y_{R3}, R=Y_{R2}-Y_{R3}.$$

Further, the difference between the displacements J and R gives the rotational angle θ of the fine adjustment stage 11 relative to the scan stage 10.

There are fixedly mounted on the scan stage 10 three actuators 29j, 29r and 29h. The actuators 29j and 29r are spaced a predetermined distance from each other in the X-direction and drive the fine adjustment stage 11 to displace along the driving lines j and r extending in the Y-direction, while the actuator 29h drives the fine adjustment stage 11 to displace along the driving line h extending in the X-direction. The fine adjustment stage 11 may be minutely rotated by controlling the displacements to be produced by the actuators 29j and 29r, respectively. The actuator 29j comprises a rod 31j having its tip end pivotally engaged with a V-shaped groove formed in one of the side edges of the fine adjustment stage 11, and a drive motor 30j for driving the rod 31j to move in its longitudinal direction. The rod 31j has its proximal end connected with the drive motor 30j through a pivotal connection allowing a small tilt of the rod 31j. The other actuators 29r and 29h have the same construction as that described above, respectively. There are also mounted on the scan stage 10 three compression coil springs 32j, 32r and 32h associated with the three actuators 29j, 29r and 29h, respectively, for urging the fine adjustment stage 11 toward the associated actuators. By these springs 32j, 32r and 32h, the fine adjustment stage 11 is normally forced to abut against the rods of the actuators 29j, 29r and 29h. In the actuators 29j, 29r and 29h, a rotational angle of a rotary motor is converted into a linear displacement through a screw rod mechanism.

Here, the projection magnification ratio of the projection lens system 8 is represented by β. When a scanning projection exposure is made, the scan stage 10 in FIG. 7(b) is moved in +Y-direction (or −Y-direction) with a velocity $V_R$, while the Z/θ-axes drive stage 4 in FIG. 7(a) is moved, in synchronism with the movement of the scan stage 10, in −Y-direction (or +Y-direction) with a velocity β·$V_R$, for scanning. That is, the design value of the velocity ratio between the scan stage 10 and the Z/θ-axes drive stage 4 is β. However, the actual velocity ratio may have an error and thus may deviate from the design value of β. Further, it is also possible that the relative rotational angle between the scan stage 10 and the Z/θ-axes drive stage 4 may exceed a predetermined allowable value. Under these situations, it is required to control the position and/or the rotational angle of the fine adjustment stage 11 relative to the scan stage 10 (see FIG. 7(b)) in order to null the error in the velocity ratio and/or the error in the relative rotational angle. The fine adjustment stage 11 is much lighter in weight than the scan stage 10 to provide a quicker response, so that the control of the position and/or the rotational angle can be made quickly even during a scanning projection exposure.

FIG. 8 shows a control system for controlling the rotational speed of the rotary motor in the actuator 29h in FIG. 7(b). In FIG. 8, a speed error signal I (in volts) from a displacement-to-voltage conversion unit (not shown) is supplied to a subtracter 33A. A rotational speed signal from a tachogenerator (i.e., a tachometer generator) is supplied to the subtracter 33A as well. At the subtracter 33A, the accumulated signal is subtracted from the signal I to produce a differential signal, which is supplied to the amplifier 34A, whose transfer function is represented by E(s). The amplifier 34A outputs a drive signal which drives the rotary motor 35A, whose transfer function is represented by M(s), to cause the rotary motor 35A to rotate at a rotational speed $Y_1$ (rad./s). The rotational speed $Y_1$ of the rotary motor 35A is detected by the tachogenerator 36A, whose transfer function is represented by T(s). Also, the rotational speed $Y_1$ is integrated by an integrator 37A, comprising a rotating shaft, into a rotational angle $Y_2$ (rad.), which in turn is converted by a threaded member 38A (which is a threaded portion of the rod 31h in FIG. 7(b)) into a displacement Y(m) along the driving line h. With the pitch of the thread of the threaded member 38A being P(m), one complete rotation (=2π rad.) of the rotational angle $Y_2$ will be converted into the displacement of P(m).

In FIG. 8, the subtracter 33A, the amplifier 34A, the rotary motor 35A and the tachogenerator 36A form together a rotational speed control loop. By replacing the rotational speed control loop in FIG. 8 with a single block 39A named "rotational speed controller", we obtain FIG. 9. The rotational speed controller comprising the above listed components 33A, 34A, 35A and 36A can operate at a much higher speed than the position control loop comprising the threaded member 38A, the interferometer (not shown), and other components. Therefore, we can consider the ratio between the value of the speed error signal I and the value of the rotational speed $Y_1$ as derived at the rotational speed controller 39A, to be a rotational speed generation constant G (rad./(volt·s.), and thereby the control system in FIG. 8 can be replaced with that in FIG. 9.

The control system in FIG. 9 may be used not only for the actuator 29h but also for the other actuators 29g and 29r. FIG. 10 shows a block diagram of a conventional drive system, which comprises the mechanisms of the fine adjustment stage 11 in FIG. 7(b) and three such control systems associated with the actuators 29h, 29g and 29r, respectively.

In FIG. 10, a target displacement HT, to be measured by the interferometer 14H along the measuring line H (see FIG. 7(b)), is supplied from a target value setting unit (not shown) to a first input portion of a subtracter 40A. Also, an actual displacement H, actually measured by the interferometer 14H, is supplied to a second input portion of the subtracter 40A. At the subtracter 40A, the actual displacement H is subtracted from the target displacement HT to produce a deviation, which is supplied to a position controller 41A. At the position controller 41A, the deviation is multiplied by a displacement-to-voltage conversion factor $K_H$ to produce a velocity error signal, which is supplied to a rotational speed controller 39A. The rotational speed, which has been realized by the rotational speed controller 39A, is integrated by the integrator 37A, and the integrated value is converted by the threaded member 38A into a displacement along the driving line h. The resulting total displacement along the driving line h at the tip end of the threaded member 38A is referred to as the "displacement h".

In parallel with the above described sequence of components 40A, 41A, 39A, 37A and 38A, there are provided two similar sequences of components 40B, 41B, 39B, 37B and 38B; 40C, 41C, 39C, 37C and 38C for controlling the actuators 29j and 29r, respectively, in FIG. 7(b). Specifically, the sequence of components including a subtracter 40B, a position controller 41B, a rotational speed controller 39B, an integrator 37B and a threaded member 38B converts a target displacement JT of the fine adjustment stage 11 relative to the scan stage 10, to be measured by the interferometer 14J along the measuring line J which is coincident with the optical axis of the interferometer 14J (see FIG. 7(b)), into the displacement j along the driving line j at the tip end of the threaded member 38B of the actuator 29j. Similarly, the sequence of components including a subtracter 40C, a position controller 41C, a rotational speed controller 39C, an integrator 37C and a threaded member 38C converts a target displacement RT of the fine adjustment stage 11 relative to the scan stage 10, to be measured by the interferometer 14R along the measuring line R which is coincident with the optical axis of the interferometer 14R (see FIG. 7(b)), into the displacement r along the driving line r at the tip end of the threaded member 38C of the actuator 29r.

A mechanical conversion unit 42 in FIG. 10 corresponds to the mechanisms of the fine adjustment stage 11 in FIG. 7(b). When three displacements h, j and r are produced by the actuators 29h, 29j and 29r, respectively, the mechanisms of the fine adjustment stage 11 provides. corresponding set of three displacements H, J and R (of the fine adjustment stage 11 relative to the scan stage 10) detected along the optical axes of the three interferometers 14H, 14J and 14R, respectively. This mechanical operation is represented by a matrix T shown in the box of the mechanical conversion unit 42 in FIG. 10, which is arranged in three rows and three columns (i.e., it is a 3×3 matrix).

PROBLEMS IN THE PRIOR ART

As described above, in a conventional reticle stage having a fine adjustment stage 11, the drive system for the fine adjustment stage 11 uses the deviations between the target displacements and the corresponding actual displacements along the measuring lines H, J and R, respectively, to derive the necessary driven displacements to be produced by the three actuators 29h, 29j and 29r, respectively. However, as seen from FIG. 7(b), the crossing points between the respective measuring lines H, J and R and the fine adjustment stage 11 (i.e., measuring points) are offset from those positions on the fine adjustment stage 11 at which corresponding actuators 29h, 29j and 29r drive the fine adjustment stage 11. Therefore, due to the mechanical interference, when, for example, it is desired only to rotate the fine adjustment stage 11 about its center P by a certain minute angle, the rotation itself disadvantageously has caused minute secondary displacements of the fine adjustment stage 11 in the X- and Y-directions. Thus, it has taken a substantial time to make a fine adjustment of the position and/or the rotational angle of the fine adjustment stage 11 to certain target values, resulting in a lengthy settling time. This in turn may result in a deviation or displacement of the fine adjustment stage 11 from a target position when the position of the fine adjustment stage 11 relative to the scan stage 10 should be continuously adjusted during the scanning projection exposure.

More specifically, referring to the reticle stage in FIG. 7(b), assume that the driving line h of the actuator 29h passes through the center P of the fine adjustment stage 11 and extends in the X-direction, while the measuring line H is offset from the driving line h in the Y-direction. Under this situation, we consider an adjustment operation in which the fine adjustment stage 11 is to be only displaced a predetermined amount $J_o$ relative to the scan stage 10 along the measuring line J. To produce the required displacement, according to the drive system in FIG. 10, at first only the actuator 29j is energized to drive the fine adjustment stage 11 to displace the amount $J_o$ along the measuring line J. As the result, secondary displacements are induced in the measured displacements along the measuring lines R and H, so that the three actuators 29h, 29j and 29r will be subsequently energized and continues to operate for a certain time in an attempt to null the secondary displacements.

FIGS. 11(a) to 11(c) show how secondary displacements are induced in the measured displacements along the measuring lines R and H when the fine adjustment stage 11 is so driven as to produce a certain target (sinusoidal) displacement along the measuring line J which is coincident with the optical axis of the interferometer 14J, under a particular situation in which: the measuring line H is offset by a distance of 50 mm from the driving line h toward +Y-direction (i.e., C=−50 mm); and the target sinusoidal displacement has an amplitude of ±1 μm (10×10$^{-7}$ m) and a period of about 0.2 sec. Specifically, FIG. 11(a) shows the target displacement JT to be measured along the measuring line J. FIGS. 11(b) and 11(c) show the secondary displacements δR and δH induced in the measured displacements along the measuring lines R and H, respectively, when the target displacement JT along the measuring line J is achieved by the drive system in FIG. 10. Although it is desired that both the secondary displacements δR and δH should be zero, the control system in FIG. 10 induces the secondary displacement δR oscillating with an amplitude of about ±0.06 μm (6×10$^{-8}$ m) and the secondary displacement 8H oscillating with an amplitude of about ±0.2 μm (2×10$^{-7}$ m).

Thus, according to conventional control systems like one shown in FIG. 10, for example, even when it is desired to continuously drive the fine adjustment stage 11 only along the measuring line J, the fine adjustment stage 11 is thereby inevitably displaced continuously along the other measuring lines R and H as well, resulting in a failure to achieve an accurate position control.

OBJECTS OF THE INVENTION

Accordingly, it is an object of the present invention to provide a stage apparatus in which a predetermined mathematical model which contains measured displacements detected by a plurality of displacement detection systems (such as interferometers) is used to obtain target driven displacements, and a plurality of actuators (such as feed-screw-rod type of drive units) are used to displace a stage (such as a fine adjustment stage 11) by the target driven displacements, so that the effect of any mechanical interferences may be reduced and the stage may be positioned quickly with accuracy.

It is another object of the present invention to provide a stage apparatus in which the differences between the target driven displacements and the corresponding measured displacements are derived through a feedback device, and the differences are supplied to a mathematical operational unit at which the mathematical operation based on the mathematical model is performed, so that the stage may be positioned with high accuracy.

SUMMARY OF THE INVENTION

There is provided according to the present invention a stage apparatus, such as shown in FIGS. 1 to 4, including a stage (11) on which an object (12) to be positioned is placed, a base (10) for supporting said stage,. a plurality of actuators (29h, 29j, 29r) for independently moving said stage (11) relative to said base (10), a plurality of displacement detection systems (14H, 14J, 14R) for detecting displacements of said stage (11) relative to said base (10) at a plurality of different detection sites, said stage apparatus comprising: a target value setting system (56) for setting a plurality of target displacements (HT, JT, RT) of said stage (11) relative to said base (10) at said plurality of detection sites of said plurality of displacement detection systems; a mathematical operation system (43) for deriving target driven displacements (hT, jT, rT) to be produced by said plurality of actuators in order to achieve said plurality of target displacements (HT, JT, RT) set by said target value setting system (56), based on a mathematical model (matrix T$^{-1}$ of Equation (2)) describing the relationship between displacements (H, J, R) to be detected by said plurality of displacement detection systems and displacements (h, j, r) of said stage (11) relative to said base (10) to be produced by said plurality of actuators; and a drive control system (41A, 41B, 41C) for driving said plurality of actuators so as to cause them to produce displacements corresponding to said target driven displacements derived by said mathematical operation system.

It is preferable that said stage apparatus may further comprise a feedback system (40A, 40B, 40C) for producing a plurality of differences (ΔH, ΔJ, ΔR) between said plurality of target displacements (HT, JT, RT) set by said target value setting system (56) and a plurality of corresponding displacements (H, J, R) actually detected by said plurality of displacement detection systems, respectively; and that said plurality of differences produced by said feedback system may be supplied to said mathematical operation system (43).

An example of said mathematical model may comprise a matrix having nondiagonal components (matrix T$^{-1}$ of Equation (14)).

The principle of the present invention having the above arrangement will now be described. For convenience, we assume here that the stage (11) is driven relative to the base (10) by three actuators 29h, 29j and 29r, and the displacements of the stage (11) relative to the base (10) are detected by three interferometers 14H, 14J and 14R serving as the displacement detection means. When the actuators 29h, 29j and 29r are energized to produce the driven displacements h, j and r, respectively, the measured displacements H, J and R measured by the interferometers 14H, 14J and 14R, respectively, are expressed in a form of 3×3 matrix T as $$\begin{pmatrix} H \\ J \\ R \end{pmatrix} = T \begin{pmatrix} h \\ j \\ r \end{pmatrix} \quad (1)$$

If the matrix T has at least one non-zero nondiagonal component, a mechanical interference will occur. In order to substantially eliminate the mechanical interference, we deform Equation (1) above into a new equation using a unit matrix. For this purpose, we multiply both sides of Equation (1) by an inverse matrix T$^{-1}$ of the matrix T to obtain $$\begin{pmatrix} h \\ j \\ r \end{pmatrix} = T^{-1} \begin{pmatrix} H \\ J \\ R \end{pmatrix} \quad (2)$$

The inverse matrix T$^{-1}$ is a conversion matrix for deriving, directly from the measured displacements H, J and R measured by the interferometers 14H, 14J and 14R, the driven displacements h, j, r produced by the actuators 29h, 29j and 29r. This inverse matrix T$^{-1}$ is an example of the mathematical model which may be used for the present invention. Here, the target displacements of the stage (11) relative to the base (10), i.e., the target measured displacements to be measured through the interferometers 14H, 14J and 14R, are represented by HT, JT and RJ. Also, the target driven displacements to be produced by the actuators 29h, 29j and 29r are represented by hT, jT and rT. The relationships of Equations (1) and (2) also do exist between the target measured displacements and the target driven displacements. Then, using Equation (2), we obtain the following equation.

$$\begin{pmatrix} HT \\ JT \\ RT \end{pmatrix} = \begin{pmatrix} 100 \\ 010 \\ 001 \end{pmatrix} \begin{pmatrix} HT \\ JT \\ RT \end{pmatrix} = TT^{-1} \begin{pmatrix} HT \\ JT \\ RT \end{pmatrix} = T \begin{pmatrix} hT \\ jT \\ rT \end{pmatrix} \quad (3)$$

Equation (3) means that, at first the target driven displacements hT, jT and rT are derived from the target measured displacements HT, JT and RT by a calculation using the inverse matrix $T^{-1}$, and then the actuators 29h, 29j, 29r are driven to produce the driven displacements corresponding to the derived target driven displacements hT, jT and rT. Here, the relationship expressed by Equation (1) does exist, so that the target measured displacements HT, JT and RT are achieved when the target driven displacements hT, jT and rT has been produced. In other words, Equation (3) is considered to be the equation in which the conversion matrix T in Equation (1) is replaced with the unit matrix, by using the inverse matrix $T^{-1}$ to convert the target driven displacements hT, jT and rT into the target measured displacements HT, JT and RT to be measured by the interferometers 14H, 14J and 14R. Because a unit matrix has no non-zero nondiagonal component, any mechanical interferences are substantially eliminated, so that the stage (11) can be quickly positioned to a target position.

If the mathematical model used for the present invention is exactly identical to the inverse matrix $T^{-1}$, then an open loop control according to Equation (3) may provide, in principle, the target measured displacements HT, JT and RT with complete precision. On the other hand, if the mathematical model is merely an approximate matrix $T^{-1}$ which is approximate to the inverse matrix $T^{-1}$, then the target measured displacements HT', JT' and RT', which would be derived from Equation (3) using the approximate matrix $T^{-1}$ in place of the true inverse matrix $T^{-1}$, should include deviations from the true target displacements HT, JT and RT. In such a case, the feedback system (40A, 40B, 40C) can be added as shown in FIG. 3 to perform a closed loop control, so that these deviations may be nulled quickly.

According to the above described arrangement of the present invention, a mathematical model is used to derive the target driven displacements from the measured displacements detected by the displacement detection systems, and the actuators are so driven as to produce the target driven displacements thus derived, so that any mechanical interferences may be substantially reduced and the object to be positioned may be positioned to a desired target position quickly with accuracy.

Particularly, in a stage apparatus including a stage which is capable of both translation and rotation relative to a base, if the present invention is not applied to said apparatus, even when it is desired only to rotate the stage, some secondary displacements of the stage are inevitably induced by the rotation itself, so that it takes a lengthy time to complete the final positioning of the stage. In contrast, by using the present invention, no secondary displacement of the stage is induced by the rotation thereof. Thus, rotational angle control and the translation control may be carried out simultaneously, so as to improve the response speed and the positioning accuracy.

By using a feedback means to perform a feedback control, the object to be positioned can be finally positioned to a desired target position with precision irrespective of any errors in the mathematical model with respect to the actual conversion relationship between the displacements.

A mathematical model having non-zero nondiagonal components may be obtained when, for example, the model is derived using approximation sin $\theta \approx \theta$ with respect to the rotational angle $\theta$ of the stage. The use of such a mathematical model may simplify and speed up the mathematical operation.

BRIEF DESCRIPTION OF THE DRAWINGS

The above and other objects, features, and advantages of the present invention will be appreciated as the same becomes better understood by reference to the following detailed description when considered in connection with the accompanying drawings in which:

FIGS. 11(a) to 11(c) show how secondary displacements δR and δH are induced when the fine adjustment stage 11 is so driven as to produce a target displacement JT, using the conventional drive control system in FIG. 10.

PREFERRED EMBODIMENT OF THE INVENTION

Figure 6:
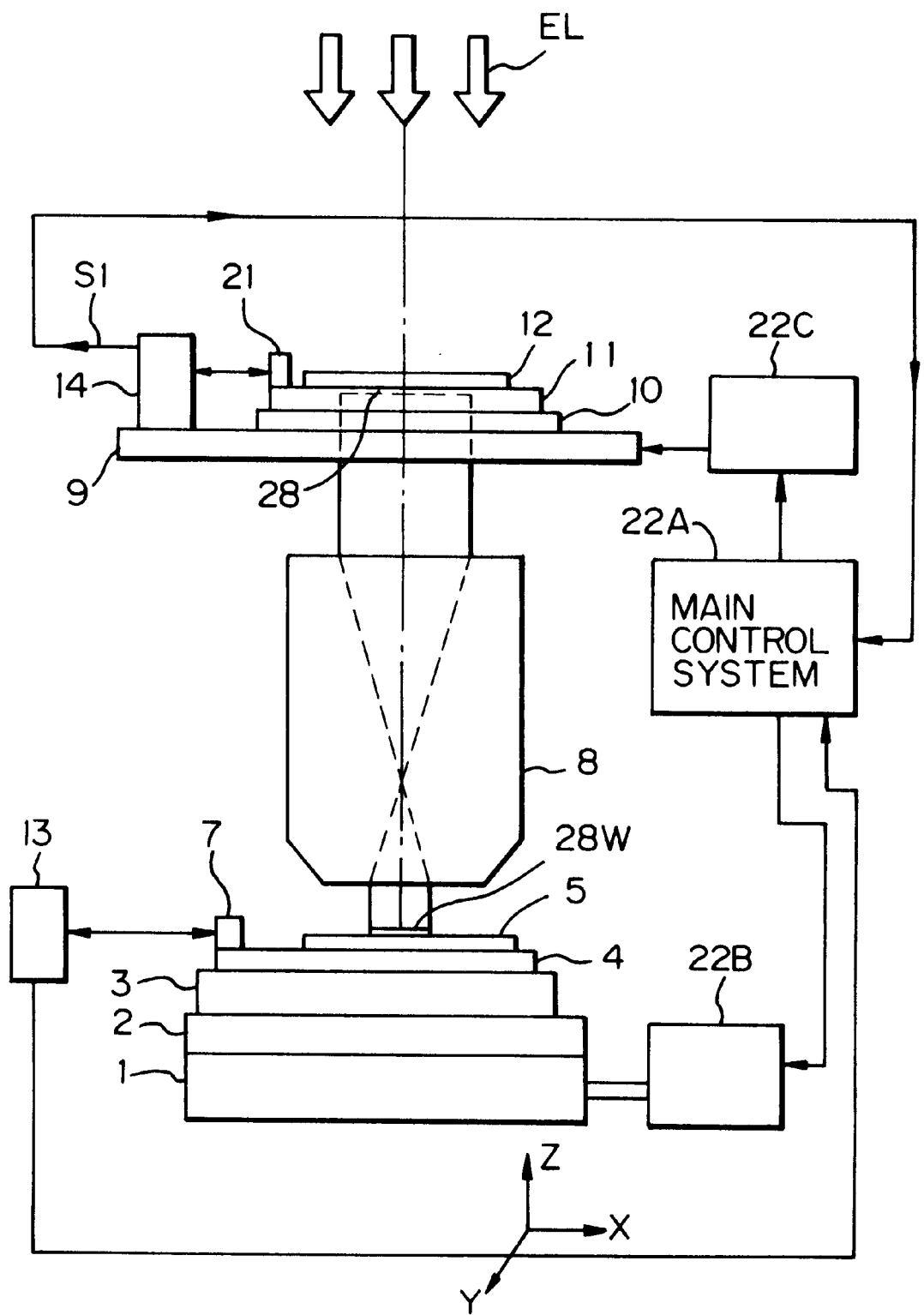
FIG. 6 is a front view of an essential part of a conventional scanning type projection exposure apparatus.
Figure 7A:
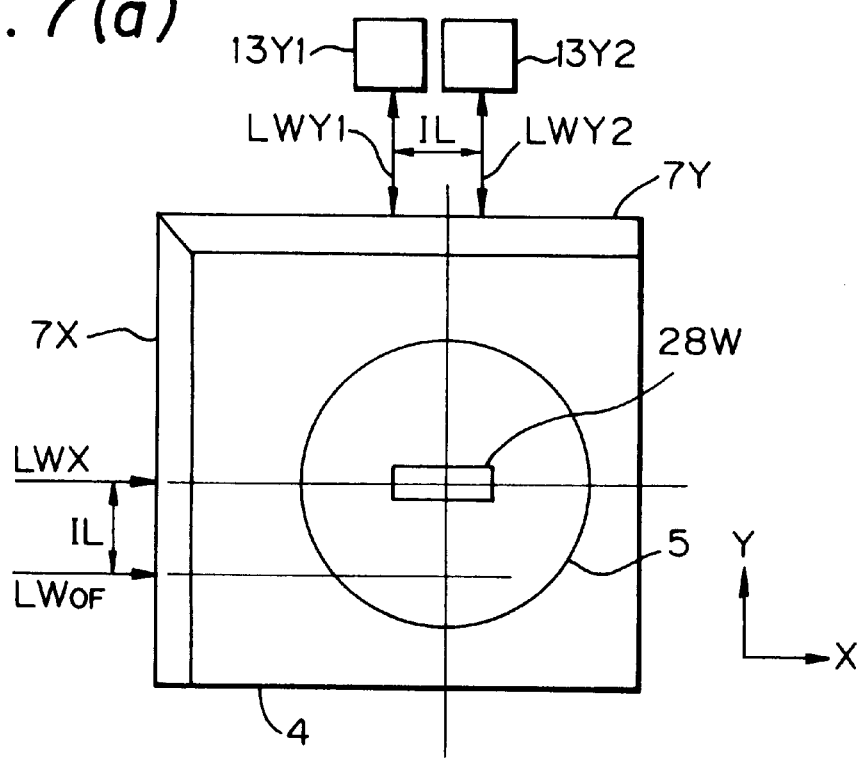
FIGS. 7(a) and 7(b) show the wafer stage and the reticle stage, respectively, shown in FIG. 6.
Figure 7B:
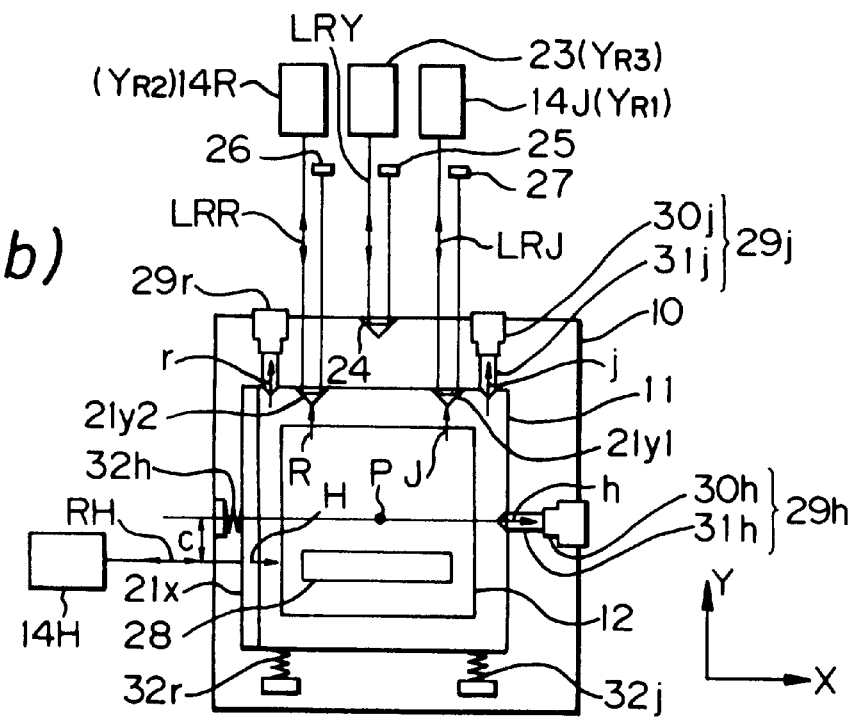
Figure 8:
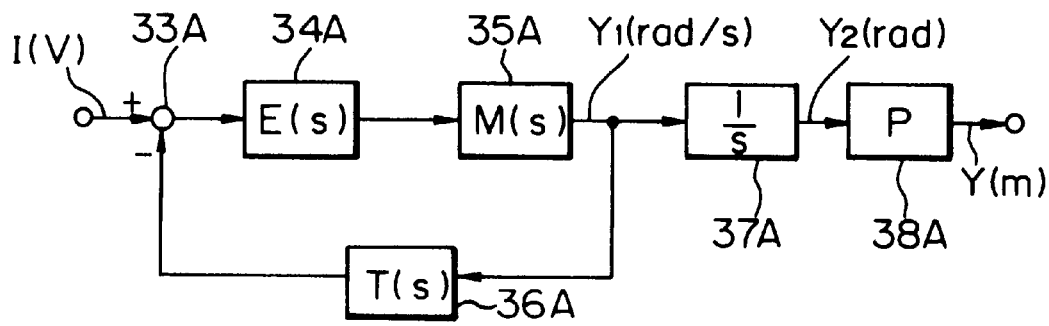
FIG. 8 is a block diagram showing a drive control system for one of the actuators used for driving the fine adjustment stage 11 in FIG. 7(b)
Figure 9:
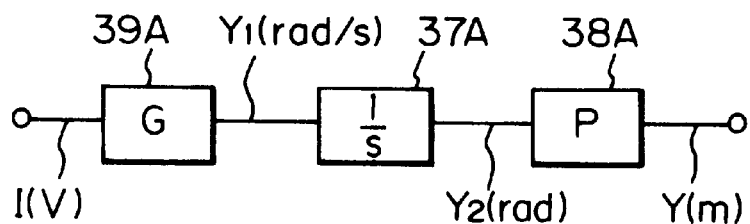
FIG. 9 is a simplified block diagram of FIG. 8 showing the drive control system.
Figure 10:
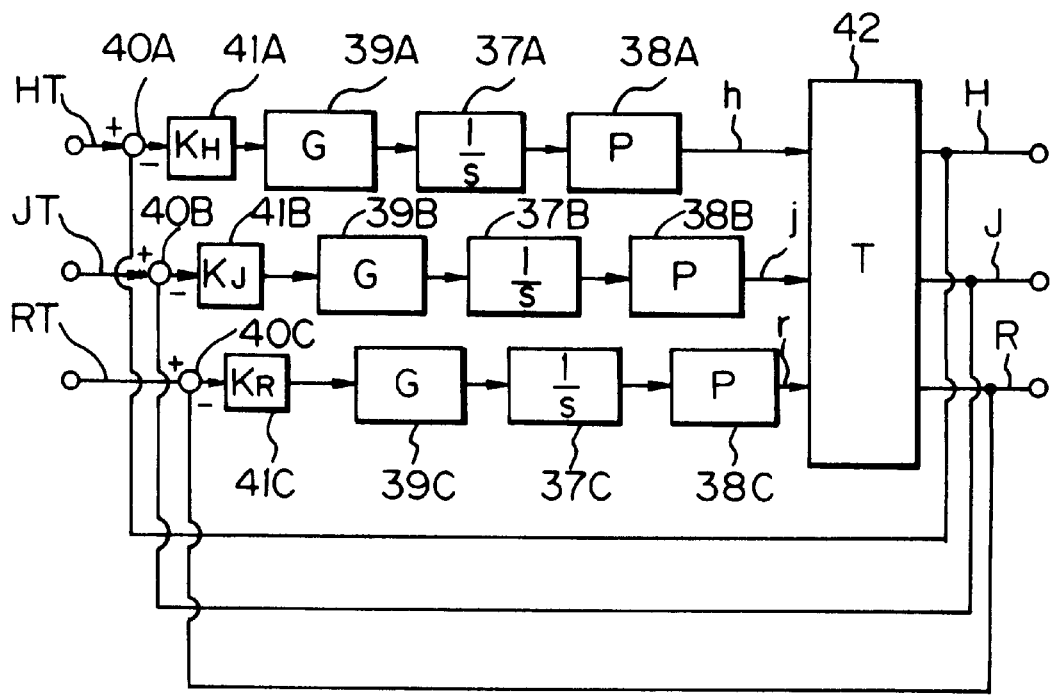
FIG. 10 is a block diagram showing a drive control system for the entire fine adjustment stage 11 in FIG. 7(b)

Referring to FIGS. 1 to 5, a stage apparatus according to a preferred embodiment of the present invention will now be described in detail. This embodiment shows an exemplified application of the present application to a reticle stage (and a controller thereof) of a projection exposure apparatus of the step-and-scan type as shown in FIGS. 6 and 7. In FIGS. 1 to 5, like components and elements are designated by the same reference numerals as FIGS. 6 to 10, and will not be described in detail for simplicity.

Figure 1:
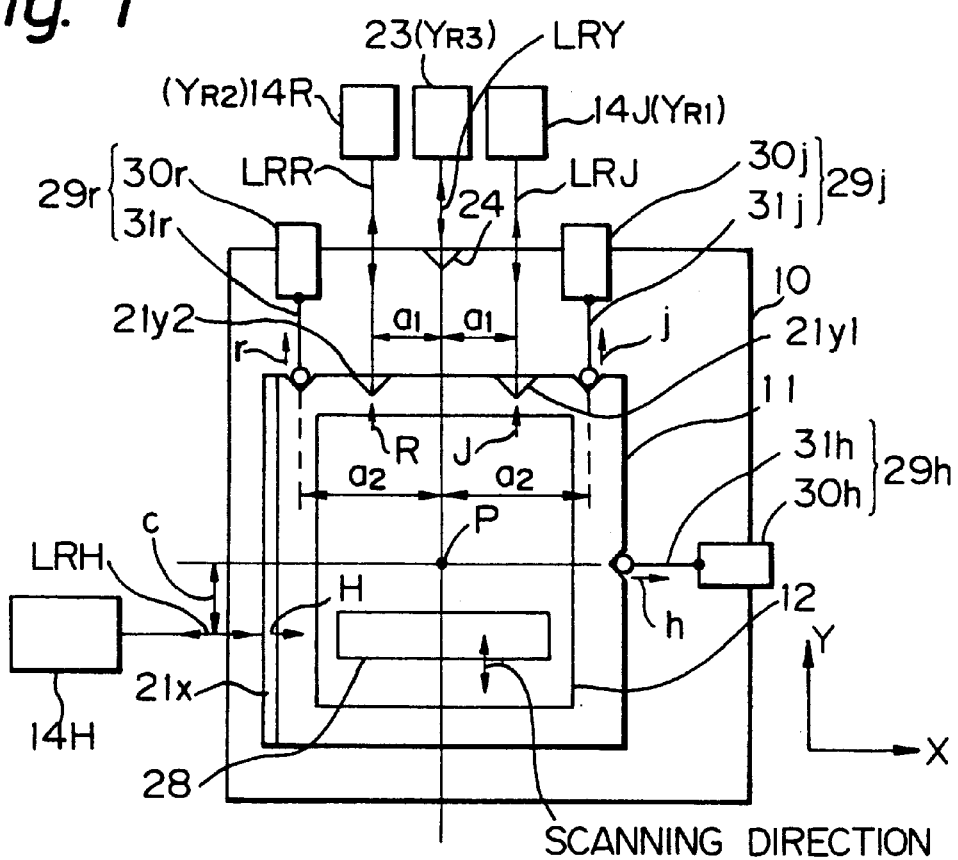
FIG. 1 is a plan view showing mechanisms of a reticle stage utilizing a stage apparatus according to an embodiment of the present invention.

FIG. 1 is a plan view of the reticle stage according to an embodiment of the present invention. In FIG. 1, a fine adjustment stage 11 is placed on a scan stage 10. A reticle 12 is held on the fine adjustment stage 11 by means of, for example, a vacuum chuck. An illumination light beam for exposure is illuminated onto the reticle 12, within a slit-shaped illumination field 28. Here, we define the longitudinal direction of the elongate illumination field 28 as the X-direction, and the direction perpendicular thereto, which is the scanning direction of the reticle, as the Y-direction. The fine adjustment stage 11 has a shape of a rectangular frame having a pair of sides extending in the X-direction and another pair of sides extending in the Y-direction.

In the reticle stage of the present embodiment, like the reticle stage previously described, there is fixedly mounted on the fine adjustment stage 11 a moving mirror 21x for X-direction measurement, on which a laser beam LRH from an interferometer 14H falls in the X-direction. The interferometer 14H is mounted on a stationary portion of the apparatus outside the scan stage 10, and serves to measure the displacement H of the fine adjustment stage 11 relative to the scan stage 10, along a measuring line H which is coincident with the axis of the laser beam LRH. There are also fixedly mounted on the fine adjustment stage 11 two corner cubes (corner reflectors) 21y1 and 21y2, on which two laser beams LRJ and LRR from interferometers 14J and 14R fall in the Y-direction, respectively. The interferometers 14J and 14R are mounted on stationary portions of the apparatus outside the scan stage 10, and serve to measure the Y-coordinates $Y_{R1}$ and $Y_{R2}$ of the fine adjustment stage 11 using the double-path technique. Further, there is fixedly mounted on the scan stage 10 a corner cube 24, on which a laser beam LRY from an interferometer 23 falls in the Y-direction. The interferometer 23 is mounted on a stationary portion of the apparatus outside the scan stage 10, and severs to measure the Y-coordinate $Y_{R3}$ of the scan stage 10 using the double-path technique. Although there are provided, for the double-path technique, three mirrors corresponding to those (25 to 27) shown in FIG. 7(b), they are omitted in FIG. 1 for simplicity.

The displacement J of the fine adjustment stage 11 relative to the scan stage 10, which is measured along the measuring line J which is coincident with the axis of the laser beam LRJ, is derived by subtracting the Y-coordinate $Y_{R3}$ from the Y-coordinate $Y_{R1}$. The displacement R of the fine adjustment stage 11 relative to the scan stage 10, which is measured along the measuring line R which is coincident with the axis of the laser beam LRR, is derived by subtracting the Y-coordinate $Y_{R3}$ from the Y-coordinate $Y_{R2}$. The measuring lines J and R, or the axes of the laser beams LRJ and LRR, are offset by a distance $a_1$ toward +X-direction and −X-direction, respectively, from the line which passes through the center P of the fine adjustment stage 11 and extends in the Y-direction.

On the other hand, the interferometer 14H is fixed on a stationary portion of the apparatus outside the scan stage 10, with the axis of its laser beam LRH passing through the center of the illumination field 28. Thus, when the scan stage 10 is moved in the Y-direction, the laser beam LRH moves relative to the fine adjustment stage 11 in the Y-direction and along the moving mirror 21x. FIG. 1 shows the reticle stage at a certain point of time during a scanning projection exposure process. At this point of time, the scan stage 10 has come to a position where the measuring line H (which is coincident with the axis of the laser beam LRH) is offset by a distance c toward −Y-direction from the line which passes through the center P of the fine adjustment stage 11 and extends in the X-direction.

There are fixedly mounted on the scan stage 10 two actuators 29j and 29r for driving the fine adjustment stage 11 to displace relative to the scan stage 10 in the Y-direction and along the driving lines j and r, respectively, and a further actuator 29h for driving the fine adjustment stage 11 to displace in the X-direction and along the driving line h. Each of the actuators 29j, 29r and 29h comprises a rod (31j, 31r, 31h) having its tip end pivotally engaged with a V-shaped groove formed in one of the side edges of the fine adjustment stage 11, and a drive motor (30j, 30r, 30h) for driving the rod (31j, 31r, 31h) in its longitudinal direction. The rod (31j, 31r, 31h) has its proximal end connected with the drive motor (30j, 30r, 30h) through a pivotal connection allowing a small tilt of the rod (31j, 31r, 31h). Further, there are also mounted on the scan stage 10 three compression coil springs (not shown) associated with the three actuators 29j, 29r and 29h, respectively, for urging the fine adjustment stage 11 toward the associated actuators 29j, 29r and 29h. As seen from FIG. 1, the driving line j is spaced from the line extending in the Y-direction through the center P of the fine adjustment stage 11, by a distance $a_2$ toward +X-direction, the driving line r is spaced from the line extending in the Y-direction through the center P of the fine adjustment stage 11, by the same distance $a_2$ toward −Y-direction, and the driving direction h is coincident with the line which passes through the center P of the fine adjustment stage 11 and extends in the X-direction.

Next, we derive an exemplified form of a 3×3 (three by three) inverse matrix $T^{-1}$ which is used in the present embodiment to derive the displacements h, j and r along the driving lines h, j and r, respectively, from the displacements H, J and R along the measuring lines H, J and R, respectively. For the purpose, we consider the transition of the condition from one shown in FIG. 1 to another shown in FIG. 2. Assume that, in the condition shown in FIG. 1, the displacements H, J and R and the displacements h, j and r are all zero, and the center P of the fine adjustment stage 11 lies at the normal center position. After the transition, in the condition shown in FIG. 2, the fine adjustment stage 11 has been translated such that its center P is away from the normal center position $P_o$ by a distance p in the X-direction and a distance q in the Y-direction, as well as the fine adjustment stage 11 has been rotated in a counter-clockwise direction by an angle θ (rad). Note that the calculations shown below are approximations based on the fact that the rotational angle θ is nearly zero so that we can use the approximations sin θ≅θ and cos θ≅1.

Figure 2:
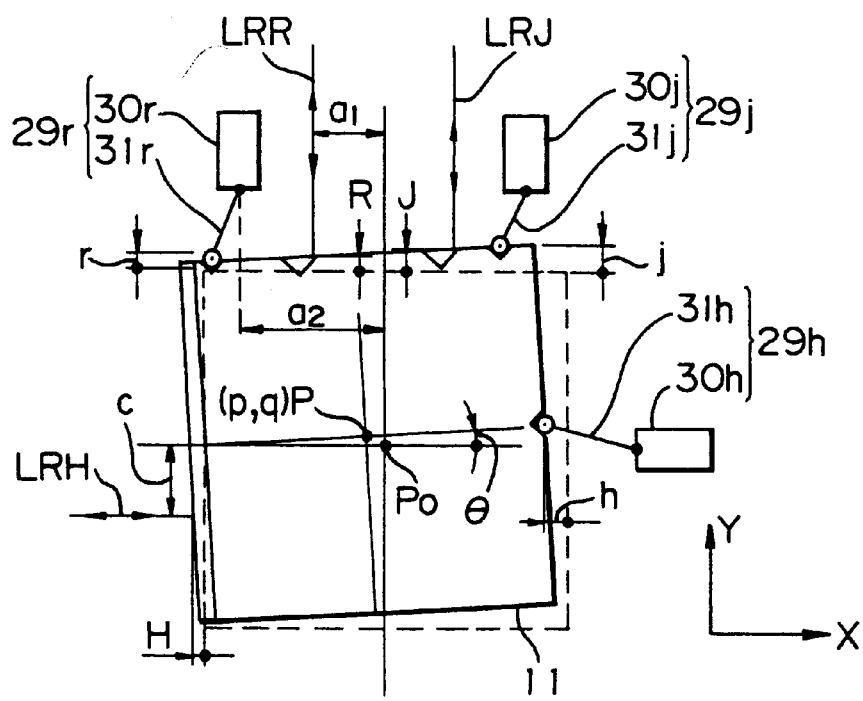
FIG. 2 is a plan view showing a fine adjustment stage 11 of the reticle stage in FIG. 1, being displaced from its normal position.

In FIG. 2, the normal center position $P_o$ is the position where the center P lies in the condition in FIG. 1, and the coordinates (p, q) of the center P in FIG. 2 are taken relative to the origin $P_o$. The displacement H measured by the interferometer 14H can be expressed using the above approximations as $$H = c\theta + p \tag{4}$$

The displacements J and R can be expressed using the above approximations as $$J = a_1\theta + q \tag{5}$$

$$R = -a_1\theta + q \tag{6}$$

From Equations (5) and (6) above, we can know coordinate q and angle θ as $$q = (J+R)/2 \tag{7}$$

$$\theta = (J-R)/(2a_1) \tag{8}$$

Replacing θ in Equation (4) with Equation (8), we can obtain $$p = H - c(J-R)/(2a_1) \tag{9}$$

The displacement h produced by the actuator 29h along the driving line h can be expressed using the above approximations as $$h = p = H - \frac{c(J-R)}{2a_1} = H - \frac{c}{2a_1}J + \frac{c}{2a_1}R \quad (10)$$

where the coordinate p is obtained from Equation (9) above.

Similarly, the displacements j and r produced by the actuators 29*j* and 29*r* along the driving lines j and r, respectively, can be expressed using the above approximation as $$j = a_2\theta + q = \frac{a_2}{2a_1}(J-R) + \frac{R+J}{2} \quad (11)$$

$$= \frac{1}{2}\left(1 + \frac{a_2}{a_1}\right)J + \frac{1}{2}\left(1 - \frac{a_2}{a_1}\right)R$$

$$r = -a_2\theta + q = \frac{a_2}{2a_1}(J-R) + \frac{R+J}{2} \quad (12)$$

$$= \frac{1}{2}\left(1 - \frac{a_2}{a_1}\right)J + \frac{1}{2}\left(1 - \frac{a_2}{a_1}\right)R$$

where coordinate q and angle θ are obtained from Equations (7) and (8) above.

From Equations (10), (11) and (12), we can obtain the relationship between the displacements H, J and R and the displacements h, j and r in approximation as $$\begin{pmatrix} h \\ j \\ r \end{pmatrix} T^{-1} \begin{pmatrix} H \\ J \\ R \end{pmatrix} = \begin{pmatrix} 1 & -\frac{c}{2a_1} & \frac{c}{2a_1} \\ 0 & \frac{1}{2}\left(1+\frac{a_2}{a_1}\right) & \frac{1}{2}\left(1-\frac{a_2}{a_1}\right) \\ 0 & \frac{1}{2}\left(1-\frac{a_2}{a_1}\right) & \frac{1}{2}\left(1+\frac{a_2}{a_1}\right) \end{pmatrix} \begin{pmatrix} H \\ J \\ R \end{pmatrix} \quad (13)$$

Therefore, the inverse matrix $T^{-1}$ we wish to obtain is $$T^{-1} = \begin{pmatrix} 1 & -\frac{c}{2a_1} & \frac{c}{2a_1} \\ 0 & \frac{1}{2}\left(1+\frac{a_2}{a_1}\right) & \frac{1}{2}\left(1-\frac{a_2}{a_1}\right) \\ 0 & \frac{1}{2}\left(1-\frac{a_2}{a_1}\right) & \frac{1}{2}\left(1+\frac{a_2}{a_1}\right) \end{pmatrix} \quad (14)$$

As seen from Equation (14), the greater the offset c of the axis of the laser beam LRH from the center P of the fine adjustment stage 11, the greater the nondiagonal components of the inverse matrix $T^{-1}$. Therefore, the greater the offset c, it takes the longer time to complete the positioning operation when a conventional control process is used.

Figure 3:
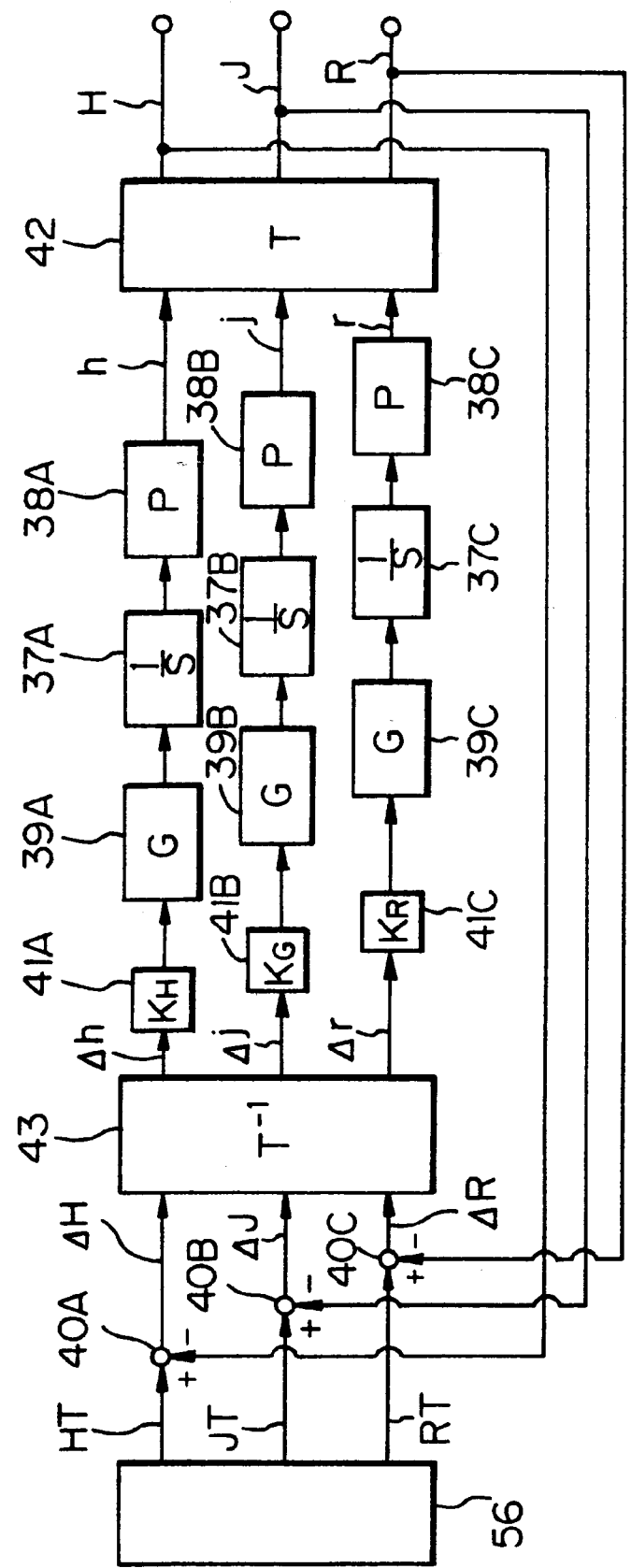
FIG. 3 is a block diagram showing a drive control system for the reticle stage of the embodiment.

Next, the control system for controlling the actuators 29*h*, 29*j* and 29*r* of the present embodiment will be described. FIG. 3 shows the control system of the present embodiment. In FIG. 3, target displacements HT, JT and RT along the measuring lines H, J and R, respectively, are supplied from a target value setting unit 56 to subtracters 40A, 40B and 40C, respectively. Actual displacements H, J and R measured by the interferometers 14H, 14J and 14R, respectively, are also supplied to the subtracters 40A, 40B and 40C, respectively. The subtracters 40A, 40B and 40C supply to a mathematical operational conversion unit 43 deviations ΔH (=HT−H), ΔJ (=JT−J) and ΔR (=RT−R), respectively. At the mathematical operational conversion unit 43, target driven increments Δh, Δj and Δr are derived by calculation as digital data, when the inverse matrix $T^{-1}$ of Equations (14) and (15) below are used. The target driven increments Δh, Δj and Δr represent the target driven displacements which are to be subsequently produced by the actuators 29*h*, 29*j* and 29*r*, respectively.

$$\begin{pmatrix} \Delta h \\ \Delta j \\ \Delta r \end{pmatrix} = T^{-1} \begin{pmatrix} \Delta H \\ \Delta J \\ \Delta R \end{pmatrix} \quad (15)$$

The target driven increments Δh, Δj and Δr thus obtained are supplied to position controllers 41A, 41B and 41C, respectively. The remaining part of the control system in FIG. 3 has an arrangement similar to that of the control system in FIG. 10 described above. That is, at the position controller 41A, the target driven increment Δh is multiplied by a displacement-to-voltage conversion factor $K_H$ to produce a velocity error signal (comprising digital data), which is supplied to a rotational speed controller 39A (comprising a rotary motor). The rotational speed realized at the rotational speed controller 39A is integrated by the integrator 37A comprising a rotating shaft, and the integrated value is converted by the threaded member 38A into a driven displacement along the driving line h. The resulting integrated displacement produced by the tip end of the threaded member 38A along the driving line h is referred to as the "displacement h".

In a similar manner, a sequence of components including a position controller 41B, a rotational speed controller 39B, an integrator 37B and a threaded member 38B converts the target driven increment Δj into the displacement j along the driving line j produced by the tip end of the threaded member 38B of the actuator 29*j*. Also, a sequence of components including a position controller 41C, a rotational speed controller 39C, an integrator 37C and a threaded member 38C converts the target driven increment Δr into the displacement r along the driving line r produced by the tip end of the threaded member 38C of the actuator 29*r*.

A mechanical conversion unit 42 in FIG. 3 corresponds to the mechanisms of the fine adjustment stage 11 in FIG. 1. When three displacements h, j and r are produced by the actuators 29*h*, 29*j* and 29*r*, respectively, the mechanisms of the fine adjustment stage 11 provides corresponding set of three displacements H, J and R which are detected along the measuring lines H, J and R, respectively. This operation is represented by a matrix T shown in the box of the mechanical conversion unit 42 in FIG. 3, which is arranged in three rows and three columns (i.e., it is a 3×3 matrix). In the present embodiment, the matrix T is an inverse matrix of the inverse matrix $T^{-1}$ shown by Equation (14) above.

Figure 4:
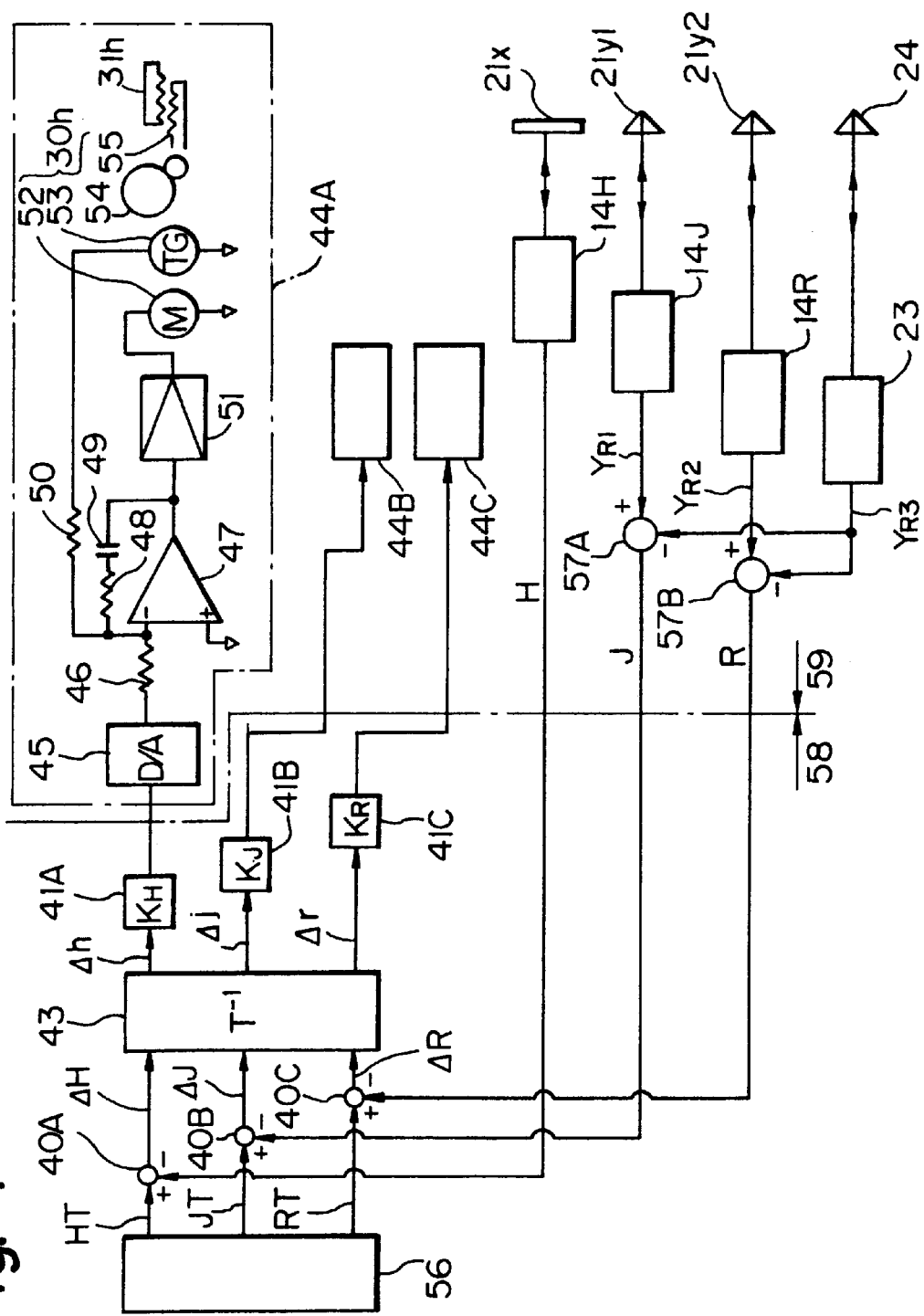
FIG. 4 is a schematic diagram showing the arrangement of the drive control system in FIG. 3 in more detail.

FIG. 4 shows a more detailed arrangement of the control system in FIG. 3. In FIG. 4, the velocity error signal (comprising digital data) from the position controller 41A is supplied to an actuator drive system 44A, where the supplied velocity error signal is converted through a digital-to-analog converter (D/A) 45 into an analog signal (voltage signal), which is supplied through a resistor 46 to an inverting input of a differential amplifier 47, whose non-inverting input is grounded.

The inverting input of the differential amplifier 47 is also connected, through a series of a resistor 48 and a capacitor 49, to an output of the differential amplifier 47. A signal generated at the output of the differential amplifier 47 is supplied through a power amplifier 51 to a rotary motor 52. A tachogenerator 53 connected to the output shaft of the rotary motor 52 generates an output signal which is feed-backed to the inverting input of the differential amplifier 47 through a resistor 50. According to this arrangement, the rotary motor 52 rotates at the rotating speed corresponding to the velocity error signal from the position controller 41A.

The rotation of the output shaft of the rotary motor 52 is transmitted through a gear train 54 to a drive screw 55, with which the threaded portion of the rod 31h is in threading engagement. The rotational angle of the drive screw 55 is thereby converted into the axial displacement of the rod 31h. In this arrangement, the combination of the rotary motor 52, the tachogenerator 53, the gear train 54 and the drive screw 55 corresponds to the drive motor 30h in FIG. 1, and the combination of the D/A 45, the differential amplifier 47, the power amplifier 51 and the drive motor 30h corresponds to the rotational speed controller 39A in FIG. 3. Also, the drive screw 55 corresponds to the integrator 37A in FIG. 3, and the threaded portion of the rod 31h corresponds to the threaded member 38A in FIG. 3.

In FIG. 4, the velocity error signals from the position controllers 41B and 41C are supplied to respective actuator drive systems 44B and 44C of the same arrangement as the actuator drive system 44A described above. In these actuator drive systems 44B and 44C, the actuators 29j and 29r in FIG. 1 are driven, respectively. The coordinate value measured by the interferometer 14H is supplied as the displacement H to a subtracter 40A. The coordinate value $Y_{R1}$ measured by the interferometer 14J and the coordinate value $Y_{R3}$ measured by the interferometer 23 are supplied to a subtracter 57A, and the displacement J derived from them at the subtracter 57A is supplied to a subtracter 40B. In parallel with this, the coordinate value $Y_{R2}$ measured by the interferometer 14R and the coordinate value $Y_{R3}$ measured by the interferometer 23 are supplied to a subtracter 57B, and the displacement R derived from them at the subtracter 57B is supplied to a subtracter 40C.

The control system in FIG. 4 may be functionally divided into two control sections 58 and 59 as separated by imaginary lines in the figure. The functions of the first control section 58, including the target value setting unit 56, the subtracters 40A, 40B and 40C, the mathematical operational conversion unit 43 and the position controllers 41A, 41B and 41C, may be performed by any suitable computer software, while the functions of the second control section 59, including the remaining components of the control system, are performed by appropriate hardware. Again referring to FIG. 3, according to the present embodiment, the inverse matrix $T^{-1}$ is used to derive the set of the target driven increments $\Delta h$, $\Delta j$ and $\Delta r$ from the set of the deviations $\Delta H$, $\Delta J$ and $\Delta R$ from the target displacements, respectively, and the target driven increments $\Delta h$, $\Delta j$ and $\Delta r$ are used to drive the actuators 29h, 29j and 29r in FIG. 1. Therefore, after the actuation of the set of actuators 29h, 29j and 29r only once, the fine adjustment stage 11 has been displaced along any of the measuring lines H, J and R, and the displacement covered along each measuring line is substantially equal to the corresponding target displacement. Thus, the position and the rotational angle of the fine adjustment stage 11 relative to the scan stage 10 can be set to the desired ones very quickly.

Even when the offset c in the Y-direction between the axis of the laser beam LRH and the line passing through the center P of the fine adjustment stage 11 and extending in the X-direction has become greater due to the scanning motion of the scan stage 10, the position control of the fine adjustment stage 11 can be quickly achieved with accuracy by using the present embodiment.

Figure 5:
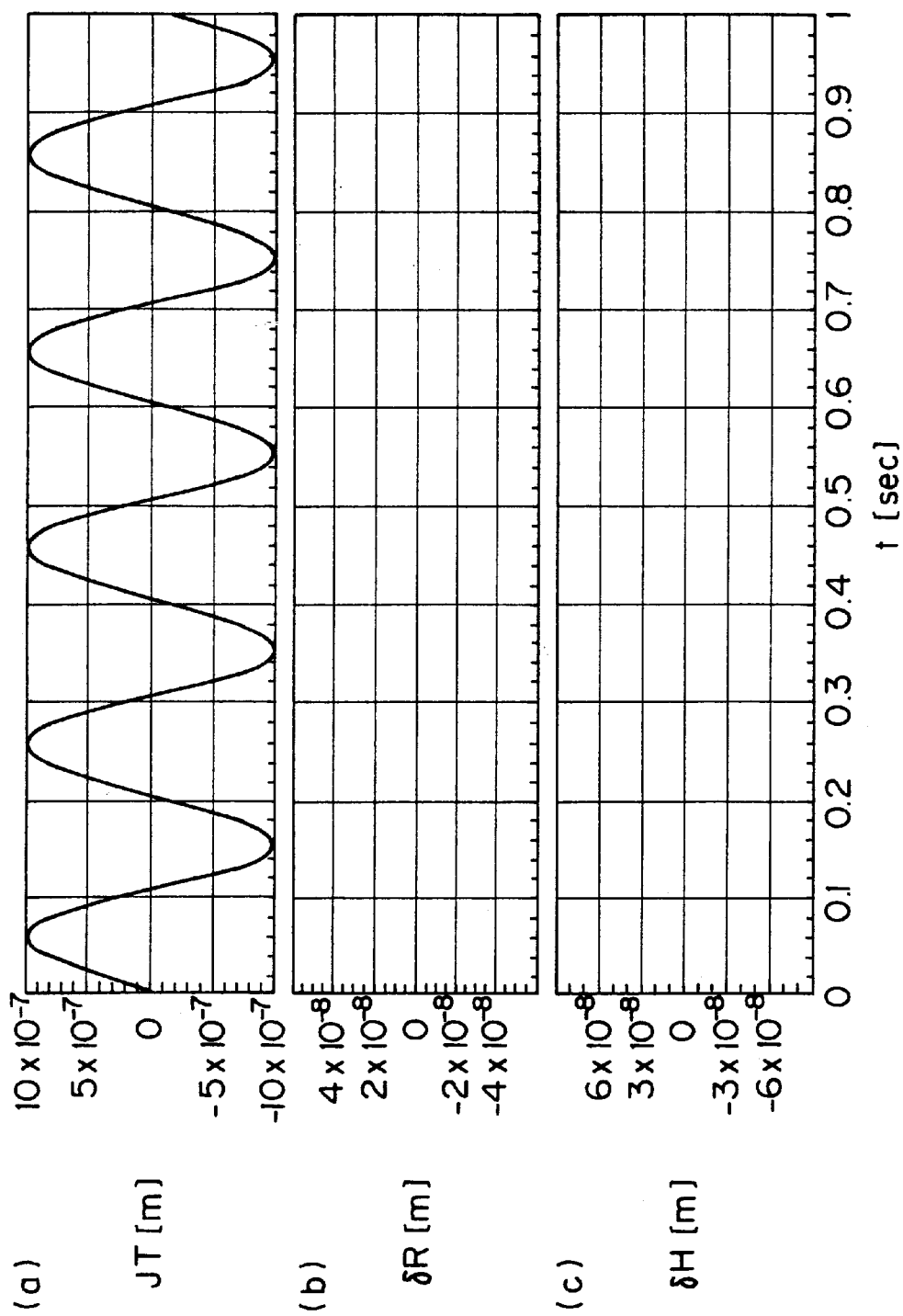
FIGS. 5(a) to 5(c) show how secondary displacements δR and δH are induced when the fine adjustment stage 11 is so driven as to produce a target displacement JT, according to the embodiment of the present invention.

By way of example, FIG. 5 shows the secondary displacements along the measuring lines R and H (which are to be zero ideally) as induced when the fine adjustment stage 11 is so driven as to achieve the target displacement JT along the measuring line J, in the reticle stage in FIG. 1. In this example, the measuring line H is offset by a distance of 50 mm toward +Y-direction from the driving line h (i.e., c=−50 mm), and the fine adjustment stage 11 is driven such that a sinusoidal target displacement JT along the measuring line J may be achieved with an amplitude of ±1 $\mu$m ($10 \times 10^{-7}$ m) and a period of about 0.2 sec. FIG. 5(a) shows the target displacement JT, while FIGS. 5(b) and 5(c) show the secondary displacements $\delta R$ and $\delta H$ along the measuring lines R and H, respectively, which is induced when the target displacement JT along the measuring line J is produced under the control of the control system in FIG. 3. By virtue of the control system in FIG. 3, both the secondary displacements $\delta R$ and $\delta H$ are suppressed to an approximate zero. In contrast, when a conventional control system is used, the secondary displacements $\delta R$ and $\delta H$ take relatively large values as shown in FIGS. 11(b) and 11(c).

In the embodiment described above, the control system includes the subtracters 40A, 40B and 40C as shown in FIG. 3, and the actually measured displacements H, J and R are feedbacked to the subtracters to perform a closed loop control. Therefore, even if the inverse matrix $T^{-1}$ used in the mathematical operational conversion unit 43 is not one which accurately describes the relationship of the conversion from the set of actually measured displacements H, J and R into the set of displacements h, j and r to be produced by the actuators 29h, 29j and 29r, but one which describes the relationship of said conversion merely in approximation, the target displacements HT, JT and RT can be quickly obtained after only several times of repetitive control operations through the control loop shown in FIG. 3. On the other hand, if the target displacements HT, JT and RT will take only small values so that the inverse matrix $T^{-1}$ can be considered as one which describes the true relationship of the conversion (in other words, if the inverse matrix $T^{-1}$ is highly accurate one), alternatively an open loop control may be performed without using the subtracters 40A, 40B and 40C. In such an open loop control, the set of target driven displacements to be produced by the actuators 29h, 29j and 29r may be derived directly from the set of target displacements HT, JT and RT at the mathematical operational conversion unit 43.

In this relation, it is sometimes inadequate to use the approximation $\sin \theta \cong \theta$ for the rotational angle $\theta$ when it is desired to perform a highly accurate mathematical operation at the mathematical operational conversion unit 43. In such a case, i.e., when it is inconvenient to use an approximation, the relationship of said conversion from the set of displacements H, J and R into the set of displacements h, j and r may be described with any complicated conversion formulae including sine and other functions. Then, the complicated conversion formulae containing, for example, a sine function would be used as a mathematical model.

In the embodiment described above, the actuators 29h, 29j and 29r use the feed-screw-rod type of drive units comprising a rotary motor and a screw rod. However, various other types of drive units may be used for the actuators, including those using electrostriction elements such as piezoelectric elements, magnetostriction elements, or voice coil motors. Moreover, linear motors may be used for the actuators. In the embodiment described above, laser interferometers are used for the displacement detection means. However, various other devices may be used as the displacement detection means, including linear and rotary encoders of the optical, magnetic, or capacitive types.

Further, the embodiment described above shows the present invention as applied to a reticle stage in a scanning type projection exposure apparatus. However, the applications of the present invention are not limited thereto, but also applicable to a wafer stage in a scanning type projection exposure apparatus, for example. Moreover, the present invention is applicable to reticle stages and wafer stages in various other types of exposure apparatuses including those of the step-and-repeat type (i.e., stationary exposure type of apparatus).

Although a particular embodiment of the present invention has been shown and described in detail, it should be understood that various changes, alterations and modifications may be made thereto, and the present invention is not limited to the described embodiment but may be embodied in various other forms without departing from the spirit and the scope of the present invention.

What is claimed is:

1. A method for producing a stage apparatus, comprising steps of:
   providing at least one stage;
   providing at least one actuator which drives said stage to a certain position in a two-dimensional plane;
   providing a plurality of detection systems which detect displacement values of said stage drive by said actuator;
   providing a target displacement setting portion which sets target displacements of said stage to be detected by said plurality of detection systems; and
   providing a calculating system which converts said set plurality of target displacement by using a single conversion model to thereby calculate a target driven value to be given to said actuator.

2. A method for producing a stage apparatus according to claim 1, wherein said actuator is provided at a predetermined site within said stage apparatus and wherein said detecting positions of said detection system are different from said predetermined position of said stage driven by said actuator.

3. A method for producing a stage apparatus according to claim 1, wherein said actuator includes a monitor.

4. A method for producing a stage apparatus according to claim 3, wherein said actuator includes a feed-screw type actuator which includes a rotary motor and a screw.

5. A method for producing a stage apparatus according to claim 1, wherein said detection system includes a first detection system which detects a displacement of said stage and a second detection system which detects a displacement of said stage at a site different from said first detection system.

6. A method for producing a stage apparatus according to claim 5, wherein said actuator includes a first actuator which drives said stage in a first direction and a second actuator which drives said stage in a second direction different from said first direction.

7. A method for producing a stage apparatus according to claim 6, wherein said first direction and said second direction intersect with each other.

8. A method for producing a stage apparatus according to claim 6, wherein said actuator further includes a third actuator which drives said stage in a direction substantially parallel to said first direction, at a site different from said first actuator.

9. A method for producing a stage apparatus according to claim 6, wherein said calculating portion caculates, based on a plurality of said target displacements, a plurality of said target driven values, each of which is to be given to each of said actuators.

10. A method for producing a stage apparatus according to claim 1, wherein said conversion model is expressed by a matrix not having non-zero nondiagonal coefficient components.

11. A method for producing a stage apparatus according to claim 10, wherein said matrix is a unit matrix.

12. A method for producing a stage apparatus according to claim 10, wherein said matrix is an inverse matrix $T^{-1}$ expressed as $$T^{-1} = \begin{matrix} 1 & -c/2a_1 & c/2a_1 \\ 0 & (1+a_2/a_1)/2 & (1-a_2/a_1)/2 \\ 0 & (1-a_2/a_1)/2 & (1+a_2/a_1)/2 \end{matrix}$$

where c is the offset of X-direction detection line of X-direction detection system from a stage center, $a_1$ is the offset of first and second Y-direction lines of first and second Y-direction detection systems from said stage center, and $a_2$ is the offset of first and second Y-direction driving lines of first and second Y-direction actuators from said stage center; and X-direction driving line of X-direction actuator passing through said stage center.

13. A method for producing a stage apparatus according to claim 1, wherein said calculating portion includes a feedback system which produces target increments corresponding to differences between said target displacement and a detected displacement detected by said detection system, said calculating portion calculating said target driven values based on said target increments.

14. A method for producing a stage apparatus according to claim 1, wherein said stage is at least one of a mask stage on which a mask is placed and a substrate stage on which a substrate is placed.

15. A method for producing an exposure apparatus that transfers a pattern formed on the mask onto the substrate, comprising a step of providing said stage apparatus according to claim 14 within said exposure apparatus.

16. A stage apparatus, comprising:
   at least one stage which moves in a two-dimensional plane;
   at least one actuator which drives said stage to a certain position in said two-dimensional plane;
   a plurality of detection systems which detect, at detecting positions different from each other, displacements of said stage driven by said actuator;
   a target displacement setting portion which sets target displacements of said stage to be detected by said plurality detection system; and
   a calculating portion which converts said set plurality of target displacements by using a single conversion model to thereby calculate a target driven value to be given to said actuator.

17. A stage apparatus according to claim 16, wherein said actuator includes a feed-screw type actuator which includes a rotary motor and a screw.

18. A stage apparatus according to claim 16, wherein said actuator includes a first actuator which drives said stage in a first direction and a second actuator which drives said stage in a second direction different from said first direction.

19. A stage apparatus according to claim 18, wherein said first direction and said second direction intersect with each other.

20. A stage apparatus according to claim 18, wherein said calculating portion calculates, based on said plurality of target displacements, a plurality of said target driven values, each of which is to be given to each of said actuators.

21. A stage apparatus according to claim 16, wherein said conversion model is expressed by a matrix not having non-zero nondiagonal coefficient components.

22. A stage apparatus according to claim 21, wherein said matrix is an inverse matrix $T^{-1}$ expressed as $$T^{-1} = \begin{matrix} 1 & -c/2a_1 & c/2a_1 \\ 0 & (1+a_2/a_1)/2 & (1-a_2/a_1)/2 \\ 0 & (1-a_2/a_1)/2 & (1+a_2/a_1)/2 \end{matrix}$$

where c is the offset of X-direction detection line of X-direction detection system from a stage center, $a_1$ is the offset of first and second Y-direction detection lines of first and second Y-direction detection system from said stage center, and $a_2$ is the offset of first and second Y-direction driving lines of first and second Y-direction actuators from said stage center; and X-direction driving line of X-direction actuator passing through said stage center.

23. A stage apparatus according to claim 16, wherein slid calculating portion includes a feedback system which produces target increments corresponding to differences between said target displacement and a detected displacement detected by said detection system, said calculating portion calculating said target driven values based on said target increments.

24. A stage apparatus according to claim 16, wherein said stage is at least one of a mask stage on which a mask is placed and a substrate stage on which a substrate is placed.

25. An exposure apparatus that transfers a pattern formed on the mask onto the substrate comprising said stage apparatus according to claim 16 in said exposure apparatus.

26. A micro device produced by said exposure apparatus according to claim 25.

27. A method for moving a stage apparatus, comprising the steps of:

detecting displacements of a stage driven by an actuator at a plurality of detecting positions different from each other;

setting target displacements of said stage to be detected at said plurality of detecting positions;

converting said set target displacements by using a single conversion model to thereby calculate a target driven value to be given to said actuator; and driving said stage by said actuator based on said target driven value.

28. A method for moving a stage apparatus according to claim 27, wherein said actuator includes a feed-screw type actuator which includes a rotary motor and a screw.

29. A method for moving a stage apparatus according to claim 27, wherein said actuator includes a first actuator which drives said stage in a first direction and a second actuator which drives said stage in a second direction different from said first direction.

30. A method for moving a stage apparatus according to claim 29, wherein said first direction and said second direction intersect each other.

31. A method for moving a stage apparatus according to claim 27, wherein, in said calculating step, based on a plurality of said target displacements, a plurality of said target driven values are calculated, each of which is to be given to each of said actuators.

32. A method for moving a stage apparatus according to claim 27, wherein said conversion model is expressed by a matrix not having non-zero nondiagonal coefficient components.

33. A method for moving a stage apparatus according to claim 32, wherein said matrix is an inverse matrix $T^{-1}$ expressed as $$T^{-1} = \begin{matrix} 1 & -c/2a_1 & c/2a_1 \\ 0 & (1+a_2/a_1)/2 & (1-a_2/a_1)/2 \\ 0 & (1-a_2/a_1)/2 & (1+a_2/a_1)/2 \end{matrix}$$

where c is the offset of X-direction detection line of X-direction detection system from a stage center, $a_1$ is the offset of first and second Y-direction detection lines of first and second Y-direction detection systems from said stage center, and $a_2$ is the offset of first and second Y-direction driving lines of first and second Y-direction actuators from said stage center; and X-direction driving line of X-direction actuator passing through said stage center.

34. A method for moving a stage apparatus according to claim 27, wherein, in said calculating step, target increments corresponding to differences between said target displacement and a detected displacement detected by said detection system is produced and thereafter said target driven value is calculated based on said target increments.

35. A method for moving a stage apparatus according to claim 27, wherein said stage is at least one of a mask stage on which a mask is placed and a substrate stage on which a substrate is placed.

36. An exposure apparatus that projects or transfers a pattern formed on a mask onto a substrate when said mask and photosensitive substrate are moved synchronously with each other, comprising:

a first stage on which said mask is placed;

a second stage which supports said first stage;

a plurality of actuators which move said first stage relative to said second stage;

a plurality of displacement detection systems which detect positions of said first stage at a plurality of difference sites;

a target displacement setting portion which sets target displacements of each of said stages to be detected by a plurality of said displacement detection systems;

a mathematical operation system which converts said plurality of target displacements by using a single conversion model to thereby calculate a plurality of target driven values to be given to said plurality of actuators; and a drive control system which drive each of said plurality of actuators based on said target driven values of each of said stage so calculated.

37. An exposure apparatus that projects or transfers a pattern formed on a mask onto a substrate, comprising:

a stage on which the substrate is placed;

a plurality of actuators which move said stage;

a plurality of displacement detection systems which detect positions of said stage at a plurality of different sites;

a target displacement setting portion which sets target displacements of each of said stages to be detected by a plurality of said displacement detection systems;

a mathematical operation system which converts said plurality of target displacements by using a single conversion model to thereby calculate a plurality of target driven values to be given to said plurality of actuators; and a drive control system which drives each of said plurality of actuators based on said target driven values of each of said stage so calculated.

38. A method for exposure comprising the steps of:

positioning the mask and the substrate relative to each other by moving the mask stage and the substrate stage relative to each other in line with the method for moving the stage apparatus according to claim 35; and transferring a pattern formed on the mask onto the substrate which is positioned relative to the mask.

39. A method for producing a device comprising a step of transferring a device pattern formed on the mask onto the substrate by using the method for exposure according to claim 38.

* * * * *